United States Patent [19]
Kornely, Jr.

[11] Patent Number: 5,520,966
[45] Date of Patent: May 28, 1996

[54] CORROSION PREVENTION OF HONEYCOMB CORE PANEL CONSTRUCTION USING ION BEAM ENHANCED DEPOSITION

[75] Inventor: Michael G. Kornely, Jr., Centerport, N.Y.

[73] Assignee: Northrop Grumman Corporation, Los Angeles, Calif.

[21] Appl. No.: 272,399

[22] Filed: Jul. 26, 1994

Related U.S. Application Data

[63] Continuation of Ser. No. 914,924, Jul. 17, 1992, abandoned.

[51] Int. Cl.$^6$ .............................. B05D 3/06; C21D 10/00
[52] U.S. Cl. ..................... 427/528; 427/531; 427/275; 148/239; 148/900
[58] Field of Search ...................... 427/528, 531, 427/271, 275, 276, 277; 148/239, 900

[56] References Cited

U.S. PATENT DOCUMENTS

| | | | |
|---|---|---|---|
| 4,021,592 | 5/1977 | Fromsom | 427/271 |
| 4,509,254 | 4/1985 | Damrow et al. | 427/126.3 |
| 4,683,149 | 7/1987 | Suzuki et al. | 427/528 |
| 4,893,743 | 1/1990 | Eylon et al. | 228/181 |
| 4,894,127 | 1/1990 | Wong et al. | 204/58.5 |
| 5,007,225 | 4/1991 | Teasdale | 52/799 |
| 5,055,318 | 10/1991 | Deutchman et al. | 427/38 |

FOREIGN PATENT DOCUMENTS

| | | | |
|---|---|---|---|
| 269112 | 6/1988 | European Pat. Off. | 427/531 |
| 3931565 | 1/1991 | Germany | 427/528 |
| 35-70278 | 6/1975 | Japan | 427/528 |
| 35-5031150 | 3/1980 | Japan | 427/528 |
| 35-9047380 | 3/1984 | Japan | 427/528 |
| 36-2174377 | 7/1987 | Japan | 427/531 |
| 1486538 | 6/1989 | U.S.S.R. | 148/239 |

OTHER PUBLICATIONS

Holbein et al, translation of the German patent 3,931,565 of Jan. 1991 to Dornier Luftfahrt, cited previously.

*Primary Examiner*—Marianne Padgett
*Attorney, Agent, or Firm*—Terry J. Anderson; Karl J. Hoch, Jr.

[57] ABSTRACT

A process for increasing the corrosion resistance of honeycomb core panel construction by using an ion beam enhanced deposition. In one aspect of the invention, molybdenum ions are embedded a predetermined depth into the front and back surfaces of a honeycomb-shaped core. The ions interact with the core metal to form an aluminum-molybdenum alloy which is impervious to corrosion. A thin film coating of metal simultaneously is produced on the surface of the metal-ion embedded core metal. The process also may be used to embed ions into the outer skin layers to achieve enhanced corrosion resistance.

9 Claims, 2 Drawing Sheets

CORROSION PREVENTION OF HONEYCOMB CORE PANEL CONSTRUCTION USING ION BEAM ENHANCED DEPOSITION

This application is a continuation of application Ser. No. 07/914,924, filed Jul. 17, 1992, now abandoned.

FIELD OF THE INVENTION

The present invention relates generally to corrosion prevention of metal alloys, and, more particularly, to a method for preventing corrosion in honeycomb core panel construction which is made from aluminum or one of its alloys.

BACKGROUND OF THE INVENTION

Honeycomb core panel construction which is made from aluminum or one of its alloys is highly susceptible to corrosion caused by atmospheric moisture. Honeycomb core panel construction utilizes two outer "skin" layers that sandwich a honeycomb-shaped core, and is used extensively in the fabrication of fins, wings and other structure in virtually all aircraft, including high-performance tactical aircraft such as the EF-111A and the F-14. Atmospheric moisture often seeps into and becomes trapped between the outer skin layers of the honeycomb core panel construction. Over time, the water seepage corrodes the honeycomb-shaped core, making the aircraft structurally unsound and, therefore, unsafe for flight. The eventual result is that the entire aircraft control surface made from the deteriorated honeycomb core panel construction must be either rebuilt or replaced at a great cost.

The formation of protective coatings on metal sheets for increasing corrosion resistance is known. For example, U.S. Pat. No. 4,894,127 discloses an anodizing process which is used to form a 1 to 3 micron thick coating of aluminum oxide onto the surface of an aluminum plate. Another process for increasing corrosion resistance involves cladding films of pure aluminum 0.002–0.005 inches thick onto the surface of sheet metal. Still another technique for increasing corrosion resistance, which is disclosed in U.S. Pat. No. 5,007,225, involves the application of paints, foams and other anti-corrosion materials to the inner and outer surfaces of metal sandwich panel structures, which are used primarily in the fabrication of ship hulls and bulkheads.

The use of surface coatings to increase the corrosion resistance of honeycomb core panel construction is undesirable for two reasons. First, the honeycomb-shaped core is left vulnerable to corrosion in those areas where the surface coatings fail to cover. Corrosion in these exposed areas eventually causes the deterioration of the entire panel, which results in the repair or replacement of the aircraft control surface at a significant cost. Second, surface coatings applied to the honeycomb-shaped core will cause a substantial increase in the weight of an aircraft, which compromises aircraft flight efficiency and performance.

An alternative corrosion prevention technique is the deposition of metal ions into the surface of a metal workpiece. For example, U.S. Pat. No. 5,055,318 discloses a method wherein an accelerated beam of argon ions is used to form a film of chromium atoms onto the surface of a metal material. The same ion beam deposition process is used to form diamond films onto the surface of metal razor blades, turbine blades and bearing races. Despite the above-stated applications, however, no known ion beam deposition process exists for increasing the corrosion resistance of honeycomb core panel construction.

The lack of an effective technique for preventing the corrosion of aluminum honeycomb core panel construction has led aircraft designers to substitute heavier, less-corrosive metals or alternative standard construction techniques. Heavier substitute metals substantially increase aircraft manufacturing costs and significantly compromise aircraft flight efficiency and performance. Even the lighter substitute metals, such as titanium, produce undesirable effects in the form of increased aircraft weight and cost. Non-corrosive, non-metallic materials may be substituted. However, such materials are also undesirable because, in addition to increasing cost, they possess a low strength-to-weight ratio.

Because aluminum has the best weight-to-strength ratio of commonly used metal, it is imperative to retain the ability to use aluminum honeycomb core panel construction in the design of aircraft control surfaces. Therefore, a need exists to provide an effective method for increasing the corrosion resistance of aluminum honeycomb core panel construction.

SUMMARY OF THE INVENTION

Accordingly, it is a principal objective of the present invention to provide a method for increasing the wear, corrosion, and scratch resistance of honeycomb core panel construction by altering the surface characteristics of a honeycomb-shaped core metal using ion beam enhanced deposition to form an alloy that is impervious to atmospheric corrosion.

It is a further objective of the present invention to provide a method for increasing the corrosion resistance in honeycomb core panel construction without achieving the weight gain realized by conventional corrosion prevention techniques.

It is a further objective of the present invention to provide a method for increasing the corrosion resistance of honeycomb core panel construction whose effects are longer-wearing than existing corrosion resistance techniques.

It is a further objective of the present invention to provide a method for increasing the corrosion resistance of honeycomb core panel construction that improves flight safety by reducing the chances of a catastrophic failure of an aircraft control surface caused by internal corrosion.

It is a further objective of the present invention to provide an improved method for increasing the corrosion resistance of honeycomb core panel construction which, over time, will achieve the benefit of a substantial reduction in life cycle material costs by eliminating the need for rebuilding or replacing vital aircraft control surfaces.

The foregoing and other objectives of the invention are achieved by providing an improved method for increasing the corrosion resistance of honeycomb core panel construction by using an ion beam enhanced deposition process. In one aspect of the invention, ions of a preselected metal are deposited a predetermined depth into the front and back surfaces of a honeycomb-shaped core metal. The depth to which ions are deposited within a surface may be adjusted to attain the extent of corrosion resistance desired. The method also produces a thin film coating of metal ions on surface of the core metal. In another aspect of the invention, enhanced corrosion resistance may be attained by embedding metal ions into the surface of the two outer skin layers of the honeycomb core panel construction.

BRIEF DESCRIPTION OF THE DRAWINGS

The preferred embodiments are described with reference to the drawings in which.

DESCRIPTION OF THE PREFERRED EMBODIMENTS

The process of the present invention, in general, pertains to increasing the corrosion resistance of honeycomb core panel construction by using ion beam enhanced deposition to embed ions of a preselected material into a honeycomb-shaped core material.

Figure 1:
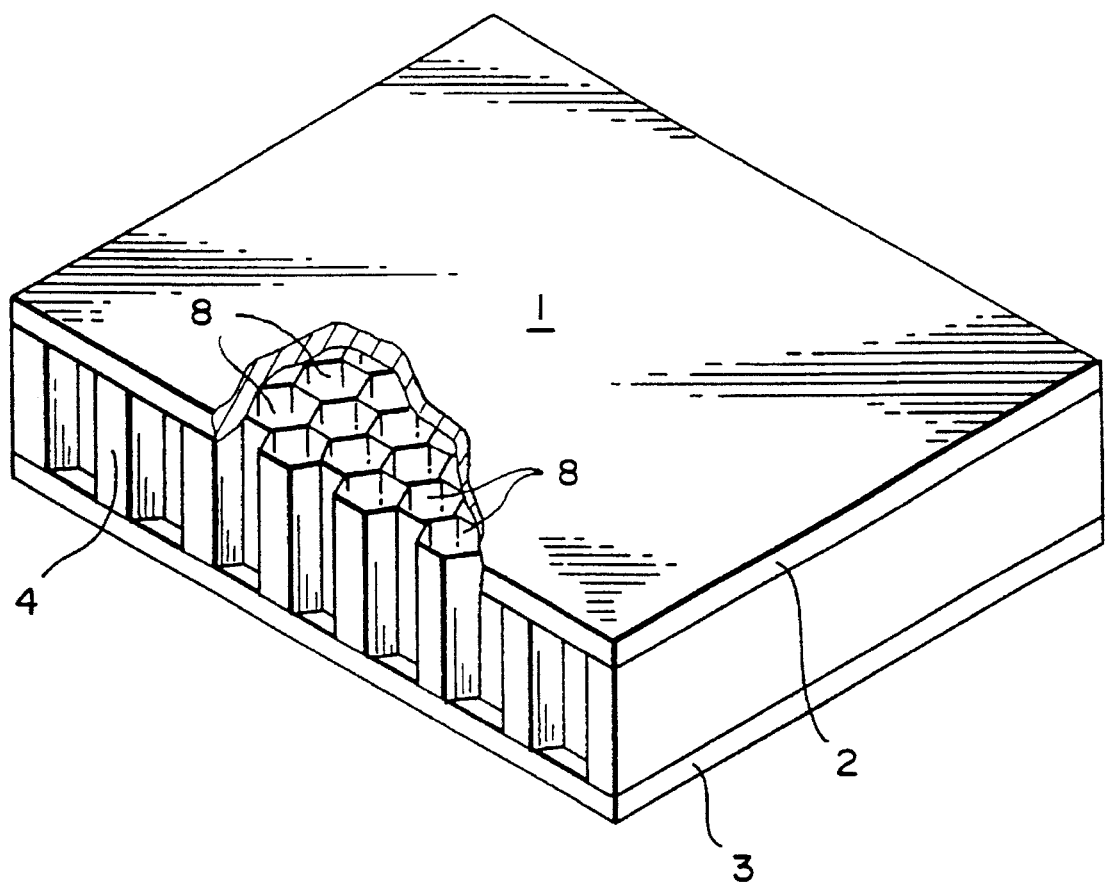
FIG. 1 is a schematic view of the core and outer skin layers of a honeycomb core panel construction which is treated to become resistant to corrosion using the method in accordance with the present invention.

FIG. 1 shows a typical honeycomb core panel construction 1 comprising outer skin layers 2 and 3 and a honeycomb-shaped core 4. Honeycomb-shaped core 4 is very thin, typically 0.0007 to 0.003 inches thick, and advantageously is constructed of a plurality of interconnected hexagonal cells 8 which are designed to enhance the structural strength of the panel construction.

Ion beam enhanced deposition initially involves placing a metal workpiece into a vacuum chamber containing a sample of a metallic element, which is the material to be implanted. The metallic element is heated to its boiling point to create a metallic ion vapor inside the chamber which surrounds the surface of the workpiece. An ion accelerator within the chamber accelerates a stream of ions of a preselected material towards the target surface of the workpiece. Ions in the stream collide with the metallic vapor ions, imparting to them kinetic energy which sends them driving into the surface of the metal workpiece.

Figure 2:
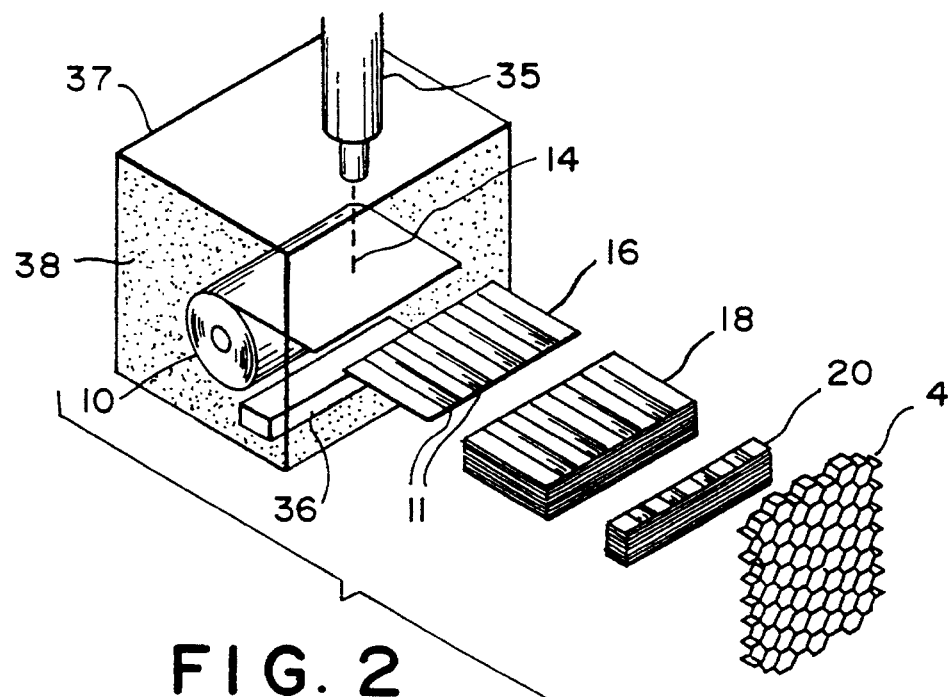
FIG. 2 is a diagram showing the steps taken in the expansion phase included in the process of the present invention.
Figure 3:
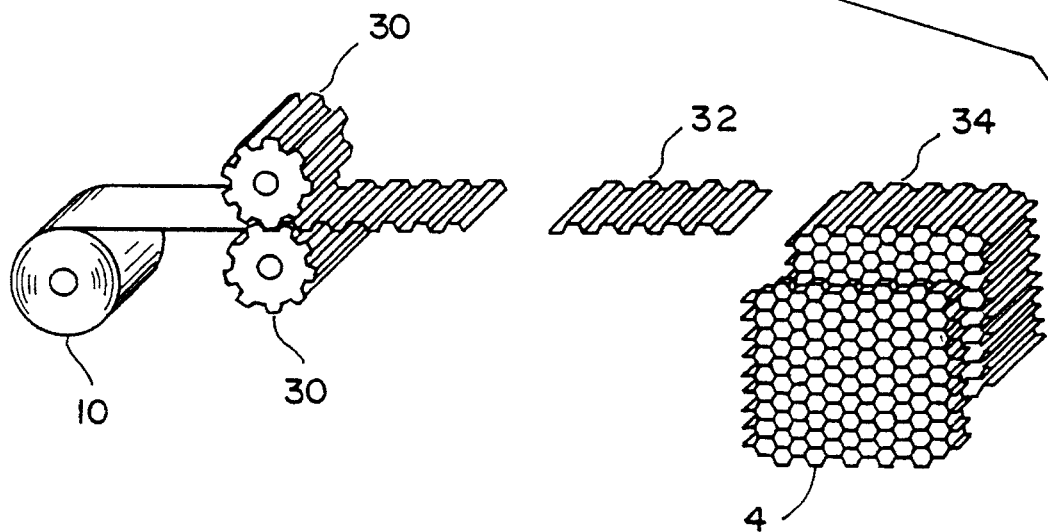
FIG. 3 is a diagram showing the steps taken within the corrugation phase included in the process of the present invention.

The corrosion prevention method of the present invention is a multi-staged process which commences during the initial manufacturing steps of the honeycomb-shaped core. The first stage of the process involves embedding ions of a preselected material into a honeycomb-shaped core metal while it is still in raw sheet metal form. As depicted in FIGS. 2 and 3, core metal 10 in web or roll form is placed within a vacuum chamber 37 containing a vapor generator 36 for forming a metallic ion vapor 38 therein. An ion accelerator 35, in communication with the interior of chamber 37, accelerates ions of a preselected material at a uniform rate to a high energy level, typically to several hundred kiloelectron volts, to form a high-speed ion stream 14 directed towards a surface of core metal 10. The ion stream 14 strikes metal ions in the vapor 38, driving those metallic vapor ions into the surface of core metal 10 to a predetermined depth. The ions mix with the atoms of the core metal to advantageously form an alloy which is impervious to corrosion from atmospheric moisture. The embedded metallic ions are so small that they can successfully treat the entire surface area of the thin core wall.

Simultaneously, the metallic ion vapor vacillating over the surface of core metal 10 forms thereon a thin film coating of the metal to provide additional protection against corrosion. The depth of ion penetration into the core metal is controlled by the magnitude of acceleration of the ion accelerator, and the thickness of the coating is controlled by the duration of the deposition process. The ion beam enhanced deposition process advantageously treats the entire surface of the metal workpiece to maximize corrosion prevention.

The second stage of the process involves either an expansion or corrugation phase during which the ion-embedded core metal is worked into a honeycomb-shaped form. During an expansion phase, as depicted in FIG. 2, the ion implanted core metal 10, while still in web form, is fed into a series of high-precision machines (not shown) which treat the surface of core metal 10 with continuous ribbons of structural adhesives 11. The now treated and ion-implanted core metal 10, shown at 16 in FIG. 2, is cut to desired dimensions and then stacked layer upon layer to form a metal block 18 having a desired thickness. This metal block is commercially known as a HOBE (honeycomb before expansion) block. Horizontal slices of predetermined thickness are sawed from metal block 18 to form a HOBE slice 20. HOBE slice 20 is then expanded using conventional techniques to form the familiar honeycomb-shaped core 4.

During a corrugation phase, as depicted in FIG. 3, the ion-implanted core metal 10 in web form is cut to a desired width and fed into the nip of a pair of corrugated rolls 30. Corrugated rolls 30 deform the core metal 10 to form a corrugated sheet 32. Corrugated sheet 32 is then cut from the roll and its surface is treated with structural adhesives (not shown). A plurality of corrugated sheets are then stacked one on top of the other to form a rigid corrugated block 34. The adhesives on each corrugated sheet 32 bind to each adjacent sheet to form a rigid, honeycomb-shaped cross-section. Slices of predetermined width are sawed off of block 34 to form a corrugated panel which constitutes a honeycomb-shaped core 4.

The above-described process may produce changes in the material characteristics, e.g., the hardness, of core metal 10 which, in turn, may adversely affect the ability of corrugated rolls 30 to deform core metal 10 into the desired cell geometry. To ensure proper deformation of the core metal during the corrugation phase, the ion beam enhanced deposition process may therefore alternatively be performed at some point after the corrugation of core metal 10. For instance, the ion accelerator 35 may be located at a position after corrugated rolls 30 (not shown) for implanting ions into the surface of corrugated sheet 32.

The third stage of the process entails forming the outer skin layers 2 and 3 of the honeycomb core panel construction so that their dimensions match the dimensions of the honeycomb-shaped core developed in the second stage. The formation of outer skin layers 2 and 3 is achieved by using conventional techniques.

The final stages of the process involve sanding, drilling and fitting the unrefined edges of outer skin layers 2 and 3 and honeycomb-shaped core 4. Outer skin layers 2 and 3 are then fixedly attached to either side of a honeycomb-shaped core 4, preferably by using an adhesive bonding process, to form a finished honeycomb core panel construction with enhanced corrosion resistance characteristics.

In the best mode and as a first aspect of the invention, honeycomb-shaped core 4 is made of aluminum or one of its alloys and the implanted ions are molybdenum. The ion accelerator directs accelerated ions of argon into the molybdenum ion vapor vacillating over the front surface of the core metal. The stream of argon ions collide with molybdenum ions in the vapor, driving the molybdenum ions through the front surface of the core metal to become implanted therein a predetermined depth into the core wall. The ions modify the surface characteristics of the aluminum core to form an aluminum-molybdenum alloy which is impervious to corrosion. By increasing the acceleration of the argon ions in the ion accelerator, the penetration of molybdenum ions into the core wall can be adjusted to achieve a required optimum depth, which is in the range extending from angstroms to microns.

In a second aspect of the method of the present invention, the front and back surfaces of the honeycomb core are embedded with ions of a preselected material to attain the most effective resistance to corrosion over long periods of time.

In a third aspect of the method of the present invention, the surfaces of outer skin layers 2 and 3 are embedded with ions in a manner identical to the ion beam enhanced deposition process used on the honeycomb-shaped core 4. Ion-embedded, outer skin layers 2 and 3 advantageously provide enhanced corrosion prevention protection by serving as an exterior barrier with respect to the underlying honeycomb-shaped core.

The process of the present invention may be used to increase the corrosion resistance of other structures made from aluminum and aluminum alloy sheet and plate, such as shelves, bulkheads and floors, as well as other metals. In addition, the process may be used to protect areas which have been made sensitive to corrosion during their fabrication process, such as countersinking and counterboring for screw holes.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

What is claimed is:

1. A process for preventing corrosion caused by atmospheric moisture in honeycomb core panel construction, said construction having two outer skin layers bonded to opposite sides of a honeycomb-shaped core, said process comprising the steps of:

providing a core metal made of aluminum which is arranged to form the honeycomb-shaped core of a thickness lying in a range between 0.0007 and 0.003 inches;

immersing the core metal in a vapor comprising metal ions;

directing a stream of ions of a material towards at least one surface of the core metal, said ion stream colliding with the metal ions in said vapor for driving the metal ions through said surface of the core metal to a depth so that an alloy is formed between said core metal and said metal ions which is impervious to said corrosion; and deforming said core metal into a honeycomb-shaped structure so as to form the honeycomb-shaped core of the honeycomb core panel construction.

2. The process as specified in claim 1, further comprising the step of forming a metal coating over said surface as metal ions are being driven through said surface.

3. The process as specified in claim 1, wherein said core metal is deformed by using either a corrugation process or an expansion process.

4. The process as specified in claim 1, wherein said metal ions are driven into front and back surfaces of the core metal, said metal ions penetrating into the core surfaces to said predetermined depth.

5. The process as specified in claim 1, further comprising the steps of providing at least one outer skin, immersing the outer skin in the ion vapor, then embedding the metal ions into at least one surface of said skin, and bonding said skin to said core.

6. The process as specified in claim 1, wherein said metal ions are molybdenum ions.

7. The process as specified in claim 1, wherein said material is argon.

8. The process as specified in claim 1, 4 or 5, wherein said depth is at least a plurality of angstroms.

9. The process as specified in claim 8, wherein said depth is at least a plurality of microns.

* * * * *